United States Patent [19]
Gallatin et al.

[11] Patent Number: 5,559,601
[45] Date of Patent: Sep. 24, 1996

[54] MASK AND WAFER DIFFRACTION GRATING ALIGNMENT SYSTEM WHEREIN THE DIFFRACTED LIGHT BEAMS RETURN SUBSTANTIALLY ALONG AN INCIDENT ANGLE

[75] Inventors: Gregg M. Gallatin, Newtown; Justin L. Kreuzer, Trumbull; Michael L. Nelson, W. Redding, all of Conn.

[73] Assignee: SVG Lithography Systems, Inc., Wilton, Conn.

[21] Appl. No.: 375,636

[22] Filed: Jan. 20, 1995

Related U.S. Application Data

[63] Continuation of Ser. No. 185,644, Jan. 24, 1994, abandoned.

[51] Int. Cl.$^6$ ........................................................ G01B 9/02
[52] U.S. Cl. ............................ 356/363; 356/349; 250/548
[58] Field of Search .................................... 356/356, 363, 356/401; 250/548

[56] References Cited

U.S. PATENT DOCUMENTS

| Re. 34,010 | 7/1992 | Magome et al. | 356/349 |
|---|---|---|---|
| 4,103,998 | 8/1978 | Nakazawa et al. | 356/152 |
| 4,200,395 | 4/1980 | Smith et al. | 356/356 |
| 4,311,389 | 1/1982 | Fay et al. | 356/354 |
| 4,390,279 | 6/1983 | Suwa | 356/401 |
| 4,402,596 | 9/1983 | Kanatani | 355/43 |
| 4,498,762 | 2/1985 | Uehara et al. | 355/55 |
| 4,629,313 | 12/1986 | Tanimoto | 355/53 |
| 4,631,416 | 12/1986 | Trutna, Jr. | 250/548 |
| 4,655,598 | 4/1987 | Murakami et al. | 356/400 |
| 4,657,379 | 4/1987 | Suwa | 355/53 |
| 4,679,942 | 7/1987 | Suwa et al. | 356/401 |
| 4,687,322 | 8/1987 | Tanimoto et al. | 355/55 |
| 4,699,515 | 10/1987 | Tanimoto et al. | 356/40 |
| 4,701,606 | 10/1987 | Tanimoto et al. | 250/201 |
| 4,702,606 | 10/1987 | Matsuura et al. | 356/401 |
| 4,711,567 | 12/1987 | Tanimoto | 355/53 |
| 4,741,622 | 5/1988 | Suwa et al. | 356/401 |
| 4,748,478 | 5/1988 | Suwa et al. | 355/53 |
| 4,792,693 | 12/1988 | Yamaguchi et al. | 250/548 |
| 4,794,426 | 12/1988 | Nishi | 355/43 |
| 4,795,244 | 1/1989 | Uehara et al. | 356/401 |
| 4,798,962 | 1/1989 | Matsumoto et al. | 250/548 |
| 4,801,208 | 1/1989 | Katoh et al. | 356/401 |
| 4,801,977 | 1/1989 | Ishizaka et al. | 355/30 |

(List continued on next page.)

OTHER PUBLICATIONS

N. Uchida et al., *A Dual Grating Alignment Method Insensitive to Mask–Wafer Gap Variation*, Bull. Japan Soc. of Prec. Engg., vol. 23, No. 2 (Jun. 1989), pp. 140–145.

M. Tabata et al., *High–precision interferometric alignment using checker grating*, J. Vac. Sci. Technol. B7(6), Nov./Dec. 1989, pp. 1980–1983.

*Primary Examiner*—Samuel A. Turner
*Assistant Examiner*—Robert Kim
*Attorney, Agent, or Firm*—Fattibene and Fattibene; Paul A. Fattibene; Robert Moll

[57] ABSTRACT

The present invention provides a grating-grating interferometric wafer alignment system, sensor and method for microlithography. It includes: (1) an electromagnetic radiation source with collimating optics delivering a collimated beam of a coherent single or multiple discrete wavelengths or in some cases broadband electromagnetic radiation; (2) a detector of the intensity of the collimated return electromagnetic radiation; (3) x- and y-oriented independent linear gratings for the mask-mark; (3) a "checkerboard pattern" grating for the wafer-mark; and (4) software including an algorithm for determining alignment from the return electromagnetic radiation intensity measured as a function of the relative position of the wafer and mask grating, and a means such as a Fourier transform determining phase and amplitude of a known frequency component of the intensity. In one embodiment a laser diode is used and the backscatter from the mask and wafer gratings is returned to the laser diode creating a beat signal used to determine alignment of the mask and wafer. Alignment accuracy is increased and made more tolerant of processing variables such as wafer topography and coatings.

5 Claims, 8 Drawing Sheets

U.S. PATENT DOCUMENTS

| | | | |
|---|---|---|---|
| 4,803,524 | 2/1989 | Ohno et al. | 355/53 |
| 4,829,193 | 5/1989 | Nishi | 250/548 |
| 4,830,486 | 5/1989 | Goodwin | 356/5 |
| 4,831,272 | 5/1989 | Imai | 250/548 |
| 4,833,621 | 5/1989 | Umatate | 364/491 |
| 4,853,745 | 8/1989 | Kamiya et al. | 355/43 |
| 4,856,905 | 8/1989 | Nishi | 356/401 |
| 4,870,452 | 9/1989 | Tanimoto et al. | 355/53 |
| 4,880,308 | 11/1989 | Shirasu | 356/401 |
| 4,880,310 | 11/1989 | Nishi | 356/401 |
| 4,897,553 | 1/1990 | Nishi | 250/548 |
| 4,943,733 | 7/1990 | Mori et al. | 250/548 |
| 4,952,815 | 8/1990 | Nishi | 250/548 |
| 4,958,082 | 9/1990 | Makinouchi et al. | 250/548 |
| 4,962,318 | 10/1990 | Nishi | 250/548 |
| 4,982,227 | 1/1991 | Suzuki | 355/53 |
| 5,003,342 | 3/1991 | Nishi | 355/43 |
| 5,004,348 | 4/1991 | Magome | 356/401 |
| 5,070,250 | 12/1991 | Komatsu et al. | 250/548 |
| 5,100,234 | 3/1992 | Ishibashi et al. | 356/349 |
| 5,118,953 | 6/1992 | Ota et al. | 250/548 |
| 5,138,176 | 8/1992 | Nishi | 250/548 |
| 5,151,749 | 9/1992 | Tanimoto et al. | 356/375 |
| 5,151,750 | 9/1992 | Magome et al. | 356/401 |
| 5,151,754 | 9/1992 | Ishibashi et al. | 356/356 |
| 5,153,678 | 10/1992 | Ota | 356/401 |
| 5,160,849 | 11/1992 | Ota et al. | 250/548 |
| 5,171,999 | 12/1992 | Komatsu et al. | 250/548 |
| 5,184,196 | 2/1993 | Nakagawa et al. | 356/401 |
| 5,204,535 | 4/1993 | Mizutani | 250/548 |
| 5,214,489 | 5/1993 | Mizutani et al. | 356/363 |
| 5,220,176 | 6/1993 | Kawai | 250/548 |
| 5,243,195 | 9/1993 | Nishi | 250/548 |
| 5,390,022 | 2/1995 | Ishizuka et al. | 356/363 |
| 5,402,230 | 3/1995 | Tian et al. | 356/349 |

MASK AND WAFER DIFFRACTION GRATING ALIGNMENT SYSTEM WHEREIN THE DIFFRACTED LIGHT BEAMS RETURN SUBSTANTIALLY ALONG AN INCIDENT ANGLE

RELATED APPLICATION

This is a continuation of United States application Ser. No. 08/185,644 filed Jan. 24, 1994 now abandoned.

FIELD OF THE INVENTION

The present invention relates in general to an alignment system, sensor and method for detecting and aligning objects. More particularly, the present invention relates to a grating-grating interferometric alignment system which employs a direct mask-to-wafer position and through-the-mask (TTM) alignment sensor for microlithography.

BACKGROUND OF THE INVENTION

A precise mask-to-wafer alignment system and method is essential for submicron lithography. A lithographic pattern must be accurately positioned (aligned) relative to prior patterns. The specialized structures used to align the patterns are often referred to as "alignment marks," or more specifically as a "mask-mark" and "wafer-mark."

Preferably, the overlay accuracy between patterns should be less than ⅕ or even less than ⅒ of the feature size. For example, overlay accuracy should be less than 0.1 microns for a 0.5 micron linewidth. A number of optical techniques are in use with varying degrees of success. However, all techniques result in limits on performance which do not fully satisfy the requirements of lithography systems.

A method of aligning objects is disclosed in U.S. Pat. No. 4,849,911 entitled "Method for Aligning First and Second Objects, relative to Each Other, and Apparatus for Practicing this Method", issuing to Uchida et al on Jul. 18, 1989, which is herein incorporated by reference. Therein disclosed is a devise for aligning a mask and wafer having diffraction gratings thereon. The intensity of the diffracted light is detected and the alignment of the mask and wafer determined. The alignment detection is independent of the gap between the mask and wafer.

While these and other alignment systems have performed adequately for their intended purpose, there is an increasing need for improving the accuracy of alignment systems. This need is particularly evident as the feature size of masks become smaller, and their alignment with a wafer becomes critical.

SUMMARY OF THE INVENTION

The present invention is useful in lithographic patterning steps during integrated circuit production. The present invention is useful for contact and proximity printing, as well as projection printing when the mask and wafer are separated by a relay lens or the equivalent. The present invention can be applied to both optical and x-ray lithography systems.

The present invention provides a technique of interferometrically sensing the relative positions of two objects by using the interference of grating orders generated by grating patches placed on each object. One particular embodiment discussed refers to in-plane alignment of a mask and wafer used in a microlithography exposure tool to an accuracy of less than about 10 nm=3σ.

The present invention provides a simple and accurate means of determining the required alignment position between a mask-pattern and a wafer-pattern to provide accurate overlay between the two patterns during lithographic patterning of integrated circuits.

In one embodiment, the present invention requires only one collimated input beam of electromagnetic radiation and senses only the variation in the total intensity of the collimated return radiation as a function of the relative in-plane position of the mask and wafer. Alignment information is determined from the intensity as a function of position by using a Fourier transform which determines the phase of a selected frequency component of the radiation. The present invention can employ a single wavelength, multiple discrete wavelengths of coherent electromagnetic radiation, or broadband electromagnetic radiation.

The present invention includes four hardware subsystems, including: (1) an electromagnetic radiation source with collimating optics delivering a collimated beam of spatially coherent single or multiple discrete wavelengths or in some cases broadband electromagnetic radiation; (2) a detector which senses the intensity of the collimated return electromagnetic radiation; (3) x and y-oriented independent linear mask gratings, which can be separate or coincident. When two gratings with different periodicity directions are coincident, that is, exist on top of another, it is referred to as a "crossed grating;" and (4) a "checkerboard grating," that is, a diagonally oriented crossed grating on the wafer. The wafer gratings are coincident and oriented diagonally with respect to the mask grating forming a pattern similar to a checkerboard.

The software subsystem includes an algorithm for determining the desired position information from the return radiation intensity measured as a function of the relative position of the wafer and mask grating. The software includes a Fourier transform algorithm which determines the phase and amplitude of a known frequency component of the intensity. All other frequency components have relevant information concerning overall operation of the sensor and can be used if necessary to assist with the alignment sensing method.

Additionally, in one embodiment an illumination source and detector illuminate a mask grating and a wafer grating. A predetermined frequency component of the returned diffracted electromagnetic radiation is detected together with its phase. The phase of the predetermined frequency component provides a direct measure of the relative position of the mask grating relative to the wafer grating. A signal processor provides position information to a motor attached to a stage which holds a wafer. The motor positions the wafer in alignment with the mask. The alignment may be done continuously so that both the mask and wafer may be moving simultaneously in a scanning operation and relative alignment between the mask and wafer maintained.

Accordingly, it is an object of the present invention to provide an alignment system with improved accuracy and reliability.

It is an advantage of the present invention that an illumination source and a detector are positioned adjacent to each other.

It is another advantage of the present invention that it is relatively process insensitive and can accommodate a wide variety of wafer surface features and coatings.

It is a feature of the present invention that a predetermined frequency component and phase of the diffracted electromagnetic radiation is detected.

DESCRIPTION OF THE PREFERRED EMBODIMENTS

Figure 1:
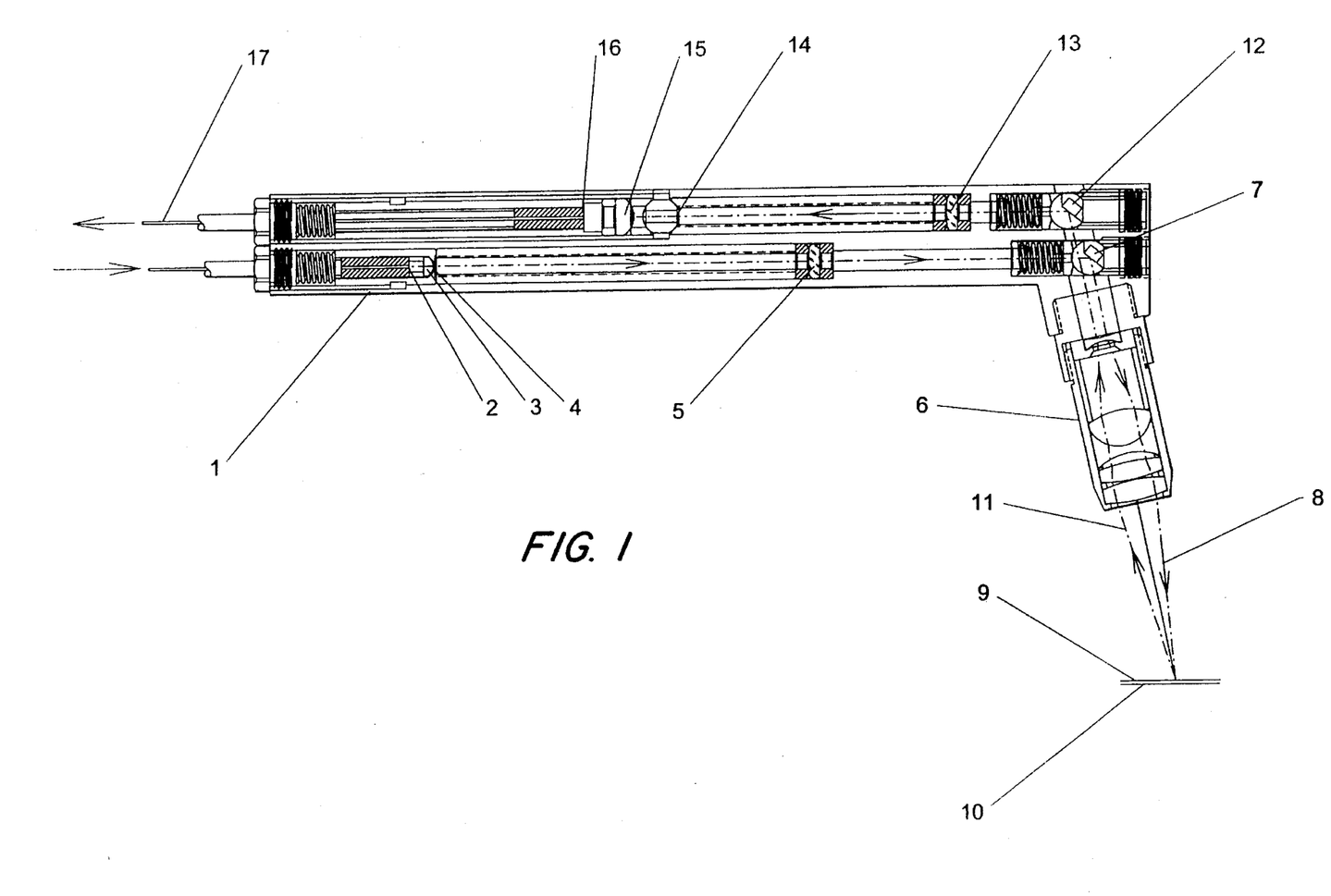
FIG. 1 is a cross-sectional view of an alignment sensor of the present invention.

FIG. 1 is a cross-sectional view of an alignment sensor of the present invention. The alignment sensor is assembled within a stable frame 1. One or more wavelengths of spatially coherent radiation, derived from a "point source," such as one or more lasers, exit from the output end of a single-mode polarization-preserving optical fiber 2. The electromagnetic radiation (e.g. light) illuminates a collimating lens 3 and an aperture 4.

Lenses 5 and 6 form a telecentric relay lens that both projects the aperture 4 onto the center of mask-mark 9 and retains the collimated wave front at the mask-mark 9. For convenience, the lenses 5, 6, are implemented as a telephoto lens which provides a large working or relief distance between the lenses 5, 6 and the mask-mark 9. For packaging convenience the lenses 5, 6 include a fold mirror 7 that is angled to keep the optics out of the path of normally incident x-ray radiation. Illumination leaves the lenses 5, 6 centered on ray 8.

Diffraction from the mask-mark 9 and the wafer-mark 10 returns the alignment signal portion of the radiation centered on the ray 11. The radiation returns through the other side of lens 6 where packaging fold mirror 12 directs the radiation through the lens 13, which duplicates the role of the lens 5. Together, lenses 6 and 13 image the mask-mark 9 onto aperture 14. Aperture 14 is slightly larger than the image of the mask-mark 9 in order to reject stray radiation. A detector (not shown) could follow aperture 14. Alternatively, lens 15 directs the radiation onto detector plane 16 containing a limiting aperture to restrict the detected radiation to the zero-order collimated-rays leaving the mask-mark 9 along path 11. Plane 16 can coincide with the face of a photodetector or a light-relay such as multi-mode fiber optic 17 that delivers the radiation to a remote photodetector (not shown).

A review of the basic grating physics is helpful in understanding the alignment sensor. A grating is any object whose electromagnetic properties (e.g. the index of refraction) periodically vary along at least one dimension. For example, the index of refraction in a grating may be a function of position n(x,y,z) satisfying the relationship n(x,y,z)=n(x+P,y,z) for all values of x where the grating plane is parallel to the x-y plane. More specifically, in surface gratings, for example, the grating "ridges and valleys" can be oriented parallel to the y-axis so that the periodicity is in the x-direction.

Figure 2:
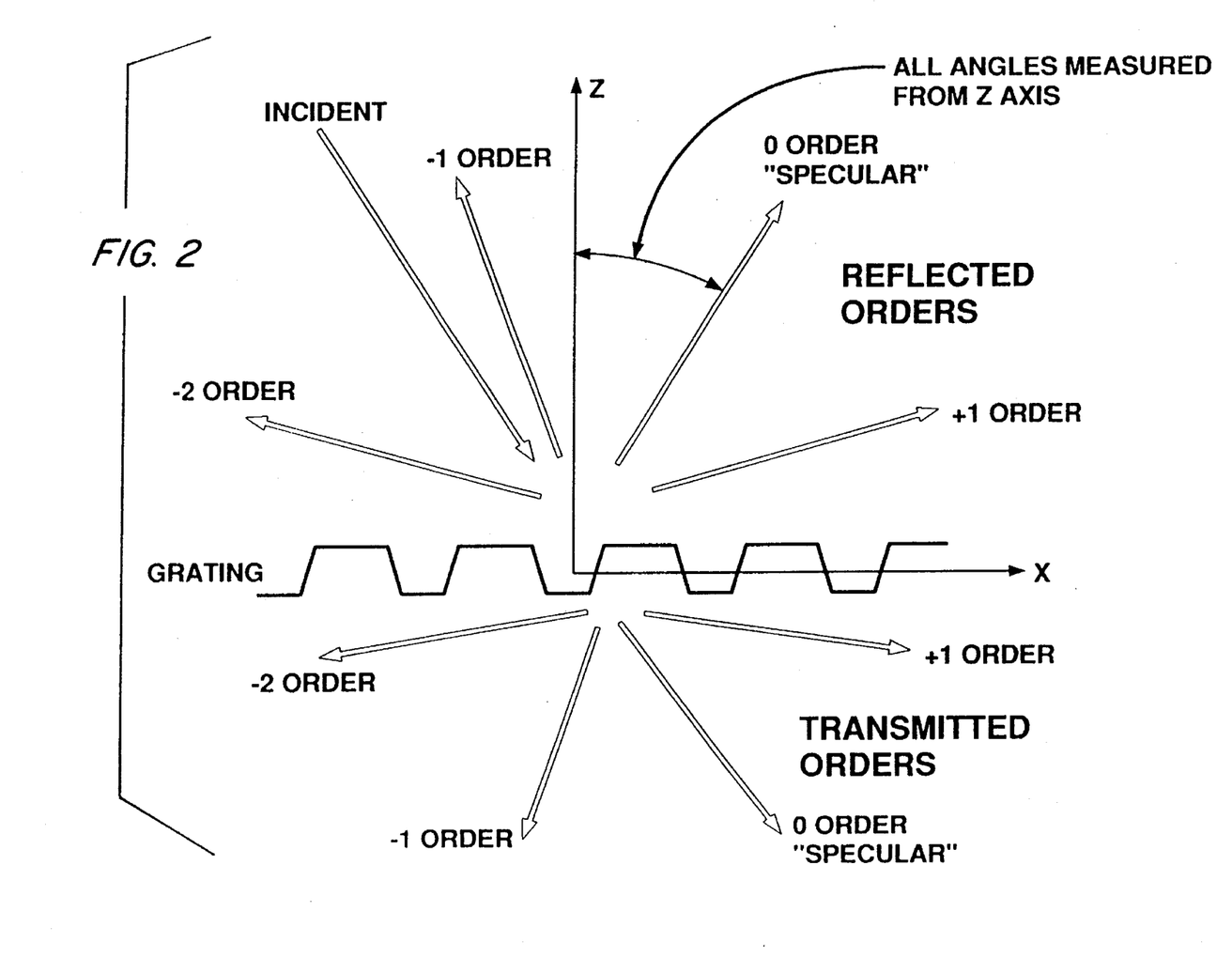
FIG. 2 is a schematic diagram of the grating order numbering convention used here.

Because a grating has periodic electromagnetic properties, when it is illuminated by electromagnetic radiation, it generates multiple transmitted and reflected waves, called "grating orders." FIG. 2 provides a typical convention for grating orders.

The grating equation defines the relationship between the angles of the grating orders as measured with respect to the z-axis, the incident angle, the wavelength of the radiation, and the period of the grating.

For reflection or transmission of plane waves from one medium into another with the same index of refraction it can be written as follows:

$$\sin(\Theta_n) = \sin(\Theta_{IN}) + n\frac{\lambda}{P}$$

where $\lambda$ is the wavelength of the illumination source, P is the period of the grating, n is the grating order number, $\Theta_{IN}$ is the incident angle measured with respect to the z-axis and $\Theta_n$ is the angle the $n^{th}$ grating order makes with respect to the z-axis.

The grating equation applies to monochromatic plane waves with the plane of incidence in the x-z plane or equivalently in the plane of the paper in FIG. 2. That is, the illumination has a single specific wavelength with a flat wavefront traveling in a specific direction in the x-z plane. In general, any electromagnetic radiation field can be represented by a superposition of plane waves.

The grating equation predicts only the angles of the grating orders. It does not determine the intensity or phase of the electromagnetic radiation in any grating order. In fact, sometimes a grating produces "missing orders," that is, one or more of the orders allowed by the grating equation contain no energy.

For n=0, we have $\Theta_{IN}=\Theta_0$ which shows that n=0 is the specular order, that is, the angle of incidence equals the angle of reflection. As shown in FIG. 2, the grating order convention used here is the following: if the grating diffraction shifts the wave to travel in a more positive (or negative) x-direction, then the grating order number is taken to be positive (or negative).

The phase of each grating order depends on the position of the grating. If the grating is shifted in the +x direction by $\Delta x$, then the phase of order n will change by $n2\pi\Delta x/P$. The dependence of the grating order phase on the horizontal position of the grating is used by the alignment sensor to detect the relative position of the wafer with respect to the mask. If $\Delta x$ is an integer multiple of P, the phase change is an integer multiple of $2\pi$ as would be expected based on the grating periodicity.

TWO DIMENSIONAL GRATING-GRATING INTERFEROMETER FOR SENSING RELATIVE POSITION:

To help understand the operation of the alignment sensor this section describes a simplified or "two-dimensional" alignment sensor. Although the "two dimensional" embodiment works in principle, it would be difficult to implement in a practical x-ray exposure tool. The next section discusses a "three dimensional" embodiment of the alignment sensor.

Figure 3:
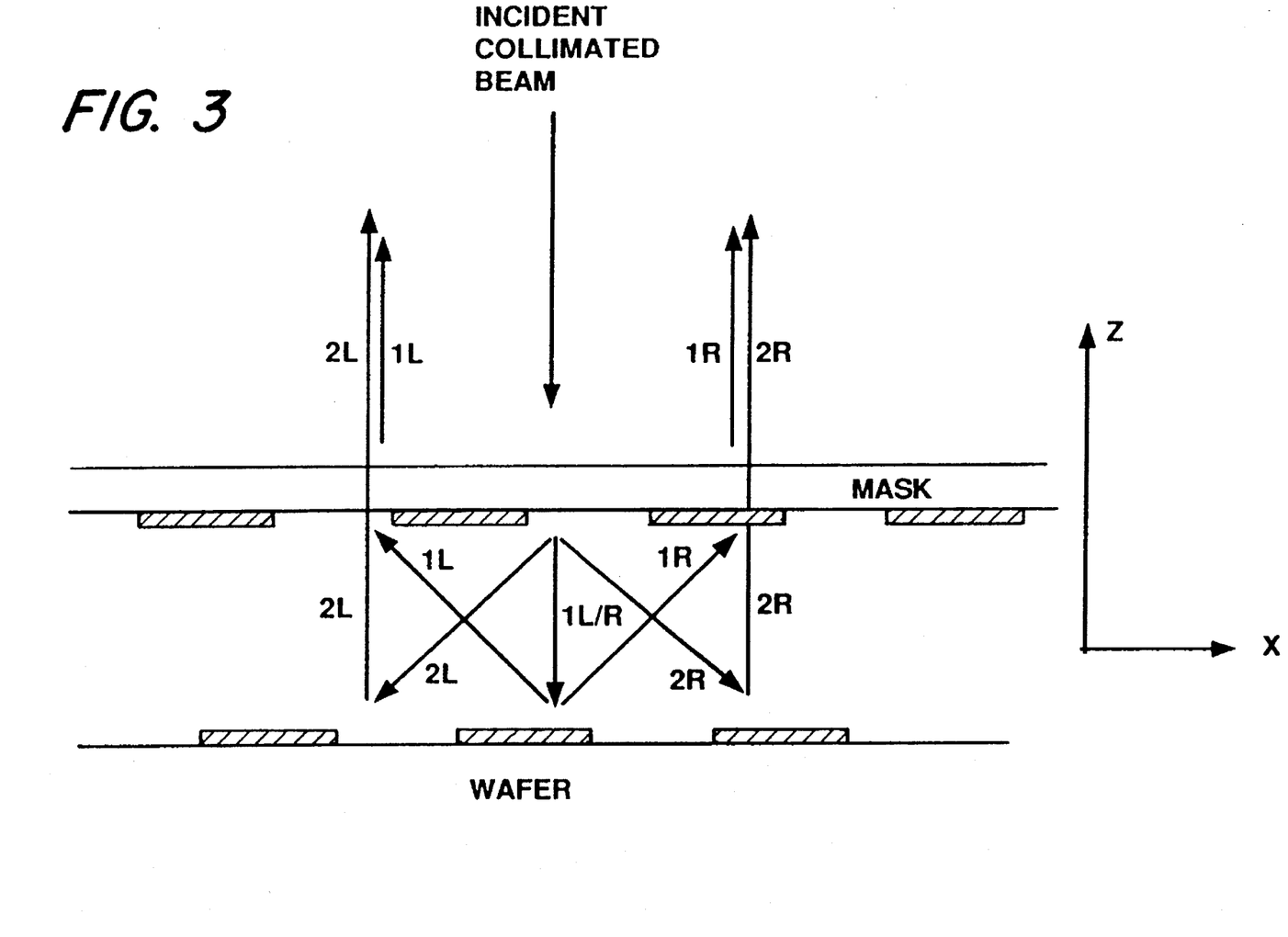
FIG. 3 illustrates two dominant diffraction paths from two parallel gratings. An incident collimated beam enters normal to the plane of the mask grating, that is, at $\Theta_{IN}=0$. The return beam exits the mask normal to the plane of the mask grating.

Consider two gratings (one at wafer and one at mask) placed parallel to each other with the illumination being a normally incident ($\Theta_{IN}=0$) plane wave coming from above as shown in FIG. 3. This discussion concentrates on the grating orders 0 and ±1 orders as shown in FIG. 3.

Other grating orders will contribute to the zero order return, but at a different frequency as a function of the relative position of the two gratings. The frequency of interest, that is, that generated by the 0 and ±1 orders as discussed below can easily be determined from scan speed and grating period. The phase of a selected frequency component of the return intensity measured as a function of the relative position of the two gratings is determined by using a Fourier transform. Thus, it is not necessary to eliminate these orders physically.

Conventional software including a Fourier transform "filters" the detected signal "after the fact" eliminating other order contributions. In one embodiment, this could be implemented on a Silicon Valley Group Lithography Systems, Inc. (SVGL) Micrascan digital signal processing board part no. 859-0741. SVGL is located in Wilton, Conn. This greatly simplifies the optical configuration because those contributions do not have to be physically removed.

The Fourier transform also provides significant averaging in addition to that obtained physically from the multiple lines in the grating. This improves the signal-to-noise ratio of the sensor as well as the insensitivity to wafer surface structure variations.

For the 0 and ±1 grating orders discussed below there are four paths by which the electromagnetic radiation can travel beginning with the incident wave to the return wave with single reflection from the wafer grating and one transmission and diffraction through the upper grating.

Higher order paths involving higher grating orders or multiple reflections and transmissions are possible. However, the amplitude of these higher orders is generally much smaller than that of any of the four lowest order paths. Moreover, the contribution of the higher diffraction orders to the signal is separated out by the Fourier transform. The all zero-order diffraction path also contributes but again its contribution can be isolated by the Fourier transform.

As shown in FIG. 3, the four paths can be divided into two pairs, numbered "1" and "2" in FIG. 3 and is distinguished by whether upper grating diffraction occurs on the way up or on the way down through the upper grating. In each pair, the electromagnetic radiation can go left (L) or right (R) when diffracted by either grating.

In terms of upper and lower grating orders these four paths are:

| GRATING ORDERS | | | | |
|---|---|---|---|---|
| | Path 1L | Path 1R | Path 2L | Path 2R |
| Step 1: Transmission down through upper grating | 0 | 0 | −1 | +1 |
| Step 2: Reflection from lower grating | −1 | +1 | +1 | −1 |
| Step 3: Transmission back through upper grating | +1 | −1 | 0 | 0 |

All four paths have the same number of transmissions and reflections. Therefore, if the upper and lower grating periods are equal, all paths contribute equally to the total return wave travelling back along the incident direction. Grating reciprocity relations require the net phase accumulated from the reflections and transmissions to be the same for all four paths. This is important because otherwise the two path pairs (1L, 1R) and (2L, 2R) will not always interfere constructively and ancillary hardware and/or optics would be required to eliminate one or the other of the pairs.

When the lower grating is shifted a distance $\Delta x$ with respect to the upper grating, the phase of the electromagnetic radiation for each path varies by the same amount. The amplitude of the total return wave is the sum of the phase factors from all four paths multiplied by the effective net reflectivity of the two gratings, r, and the effective net reflected phase factor for perfect alignment, $e^{i\psi}$. Thus, the total signal bearing return amplitude, that is, the amplitude from only the four paths discussed above is as follows:

$$re^{i\psi}\left( \underbrace{e^{-i\beta_G \Delta x}}_{1L} + \underbrace{e^{+i\beta_G \Delta x}}_{1R} + \underbrace{e^{+i\beta_G \Delta x}}_{2L} + \underbrace{e^{-i\beta_G \Delta x}}_{2R} \right)$$

where we have indicated which paths contribute which phase factors and, $$\beta_g = 2\pi P$$

The intensity of the desired frequency component of the return wave is given by the squared modulus of the amplitude. Thus, the Return Intensity at the desired frequency = $16r^2\cos^2(\beta_g \Delta x) = 8r^2(1+\cos(2\beta_g \Delta x))$.

This result shows that the intensity of the return wave from the two gratings at the desired frequency varies sinusoidally as a function of the lower to upper grating relative position, $\Delta x$, with a period:

$$p = \frac{2\pi}{2\beta_G} = \frac{P}{2}$$

Thus, the desired frequency component of the intensity of the return wave provides a direct measure of the relative position of the upper grating with respect to the lower grating to within one integer multiple of P/2. Because the variation in intensity of the return wave is caused by the phase change in the waves from different paths, the alignment sensor operates as a direct grating-grating interferometer.

When the contributions of all the orders are included then the intensity takes the form:

$$I(\Delta x) = E(\Delta x) \sum_\eta \epsilon_\eta \frac{1}{2} [1 + \cos(\eta \beta_G \Delta x)]$$

where $\eta = 0, 1, \ldots N$ with N the maximum spatial frequency that can be detected by the sensor.

The basic problem that any algorithm must solve is to determine when in $\Delta x \equiv X_{mask} - X_{wafer}$ is zero as the mask and wafer are scanned past one another by sensing just the value of $I(\Delta x)$. The coefficient $\epsilon_n$ is the intensity of the $\eta \beta_G$ frequency component of the total intensity. The $\eta=2$ term contains the signal desired to be extracted from the intensity $I(\Delta x)$ as discussed above. The $\eta \neq 2$ frequency components come from higher and lower combinations of mask and wafer grating diffraction orders. The factor $E(\Delta x)$ is an envelope function which occurs because the mask and wafer gratings are a finite size. The gratings are patches and not infinite gratings. The value of $E(\Delta x)$ is given essentially by the fractional geometric overlap of the two grating patches when the relative position of the mask and wafer grating is ($\Delta x$). It follows from this that since the size of the grating patches are much larger than the period of the gratings $E(\Delta x)$ is a slowly varying function compared to the $\eta\beta_G$ frequency of the signal being extracted from $I(\Delta x)$. Also $E(\Delta x)$ is real and symmetric about $\Delta x=0$. These facts will be used below in the Fourier transform algorithm for extracting just the $\eta=2$ contribution from the $I(\Delta x)$ data and using it to determine when $\Delta x=0$. This concept can be implemented in several different ways. Here only one particular implementation is described.

Without loss of generality it is assumed that the wafer is scanned past the mask and the intensity is measured as a function of $x_{wafer}$. In this case the condition $\Delta x=0$ reduces to determining the value of $x_{mask}$. Once this is known the wafer can then be positioned so that $x_{wafer}=x_{mask}$ thus satisfying $\Delta x = x_{mask} - x_{wafer} = 0$.

Using $\Delta x = x_{mask} - x_{wafer}$ gives $$I(x_{mask} - x_{wafer}) = E(x_{mask} - x_{wafer}) \sum_\eta \epsilon_\eta \frac{1}{2} [1 + \cos(\eta\beta_G(x_{mask} - x_{wafer}))]$$

Since $E(\Delta x)$ is a real symmetric function it can be written as $$E(x_{mask} - x_{wafer}) = \int d\beta E(\beta) e^{i\beta(x_{mask} - x_{wafer})}$$

with $E(\beta)$ a real and symmetric function of $\beta$. Substituting $$\cos(A) = \frac{1}{2}(e^{iA} + e^{-iA})$$

gives $$I(x_{mask} - x_{wafer}) = \int d\beta\, E(\beta)\, e^{i\beta(x_{mask} - x_{wafer})} \times$$

$$\sum_\eta \epsilon_\eta \frac{1}{2} \left[ 1 + \frac{1}{2} e^{i\eta\beta_G(x_{mask} - x_{wafer})} + e^{-i\eta\beta_G(x_{mask} - x_{wafer})} \right]$$

Taking the Fourier transform of $I(x_{mask} - x_{wafer} =)$ with respect to $x_{wafer}$ at the desired signal frequency $2\beta_G$ gives the signal component of $I(\Delta x) = \bar{I}(2\beta_G) =$ $$\int \frac{dx_{wafer}}{2\pi} e^{i2\beta_G x_{wafer}} I(x_{mask} - x_{wafer}) =$$

$$\sum_\eta \epsilon_\eta e^{i2\beta_G x_{mask}} \left[ \frac{E(2\beta_G)}{2} + \frac{E((2-\eta)\beta_G) - E((2+\eta)\beta_G)}{4} \right]$$

The envelope $E(\Delta x)$, as discussed above, is very wide in real space and gives in Fourier space $E(\eta\beta_G)\equiv 0$ except for $\eta=0$ and thus $$\bar{I}(2\beta_G) = \frac{1}{4} E(0)\eta_2 e^{i2\beta_G x_{mask}}$$

and therefore $$x = \frac{1}{2\beta_G} \arctan\left[ \frac{Im(\bar{I}(2\beta_G))}{Re(\bar{I}(2\beta_G))} \right]$$

where Im and Re are the imaginary and real parts of the argument respectively.

In the actual implementation the data will be sampled rather than continuous and in this case all the integrals in the above formulae are replaced by summations.

Also, as discussed below, to increase the insensitivity of the sensor to the particular process layers on the mask and wafer and to increase the sensor performance four independent wavelength from four different sources are used. The intensity at each wavelength is independently detected, recorded, and analyzed. The same Fourier transform calculation or algorithm is used for all the wavelengths and the results are averaged to obtain the optimum estimate of position at which the mask and wafer are aligned.

An important advantage to sensing the relative position in this manner is all the "action" occurs between the upper and lower grating. An ancillary external fixed reference is not required. The illumination source can be a single collimated laser beam. A single detector is used to sense the total intensity of the collimated return wave. That is, the detector operates as a "light bucket." This greatly simplifies the optics part of the alignment system relative to other alignment systems.

The detected signal does not depend on the x or y-positioning of the laser beam. Thus, positioning the illumination source and detector is not critical in our method. In one embodiment, the gratings are square patches on the order of 50×50 wavelengths. The projected electromagnetic beam only needs to be roughly on the same size as the grating patches.

Because the alignment sensor employs plane waves it is independent of the distance between the upper and lower gratings (i.e., up to a geometric limitation imposed by the finite size of the grating patches). Thus, the alignment sensor does not need to be adjusted for different "gaps" between the mask grating and wafer grating. It works independent of any gap within the above constraint. Effectively, the only requirement is that the laser beam illumination be maintained at normal incidence with respect to the mask. However, if necessary, the specular reflection from the top grating can be used to sense and correct interferometrically the illumination angle.

Figures 4A, 4B:
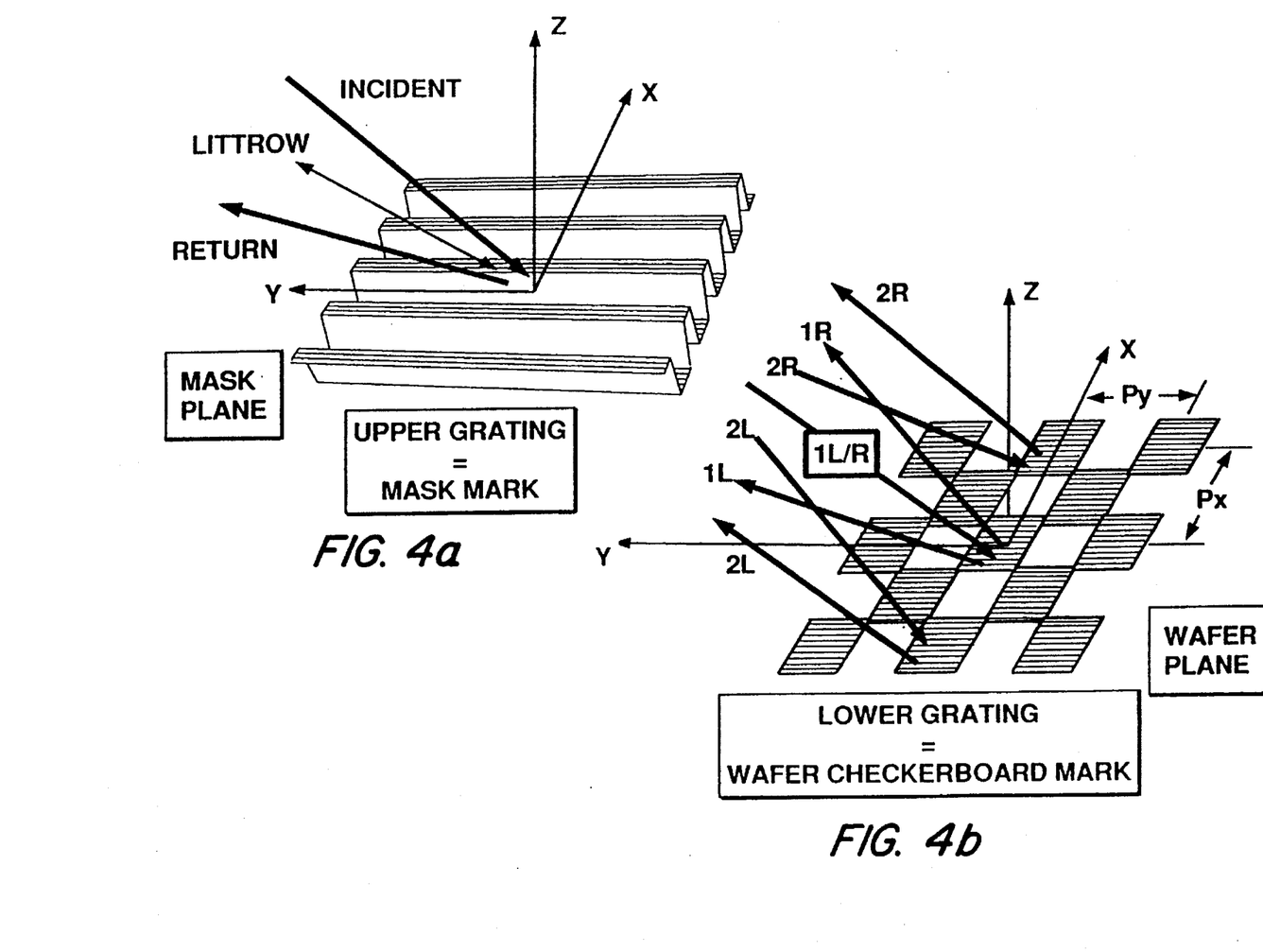
FIG. 4a–b illustrates a linear mask grating and a checkerboard wafer grating. The mask-mark and wafer-mark are shown as having an exaggerated gap to illustrate the multiple-diffraction that generates the direct-reference alignment signal.

THREE DIMENSIONAL GRATING-GRATING INTERFEROMETER FOR SENSING RELATIVE POSITION:

Although the two dimensional embodiment works in principle it would be difficult to implement in a practical x-ray or optical exposure tool for two reasons. First, the two-dimensional embodiment would have to be moved into and out of the path of the x-ray or optical exposing radiation for each alignment. Second, the phase of the all zero-order diffraction path discussed above will depend on the gap. In the two dimensional embodiment, this introduces undesired dependence of the signal on the gap. Both "problems" can be eliminated by tilting the laser illumination out of the plane of the paper in FIG. 3 and by replacing a linear lower grating with a checkerboard pattern as shown in FIG. 4b.

The checkerboard pattern can be considered as a superposition of two gratings, one oriented at an angle in a positive diagonal sense and the other oriented in a negative diagonal sense at the same angle with a negative sign, with respect to the x-axis. This superposition of the two gratings will generate combinations of grating orders in both the x and y-directions. The reason for using ± diagonal orientation and not a 0° and 90° orientation is the ± diagonal orientation maximizes energy in the x-y grating orders used by the alignment sensor. The period of the checkerboard measured along the x-axis is the same as that of the other grating. However, in one embodiment, the period of the checkerboard along the y-axis is set so that the −1 grating diffraction order in the y-direction returns nearly or exactly back along the incident direction.

Figure 5:
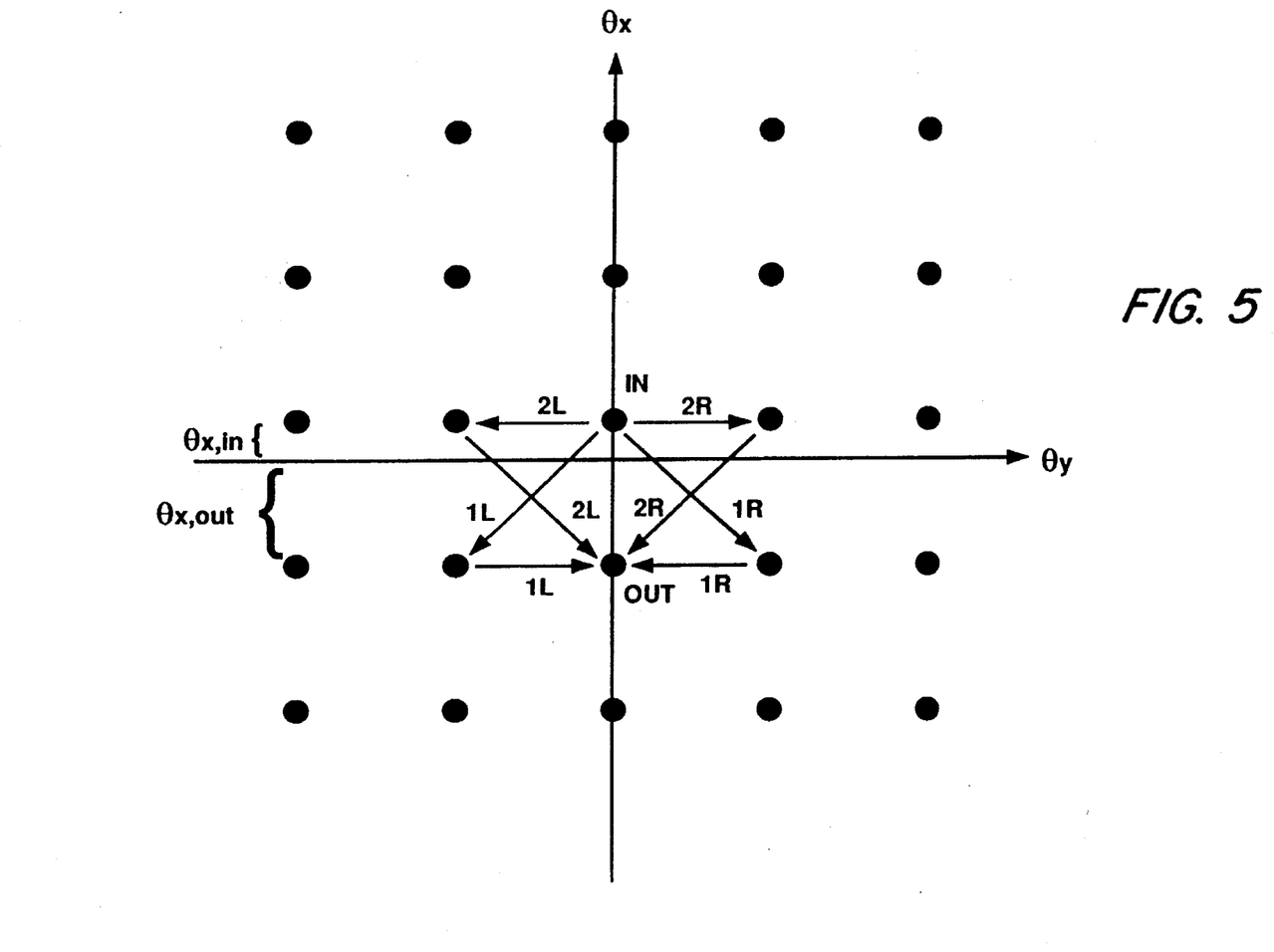
FIG. 5 illustrates the same four paths in FIG. 2 in terms of $\Theta_x$ and $\Theta_y$, which are the sines of the rotation angles about the x and y-axes, respectively.
Figure 6A:
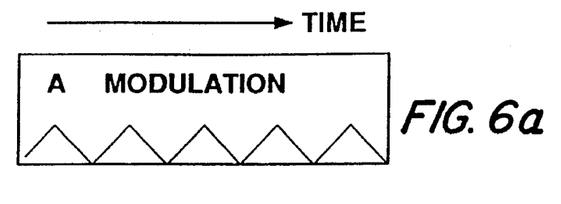
FIG. 6a–e illustrates the laser diode backscatter-modulation embodiment.
Figure 6B:
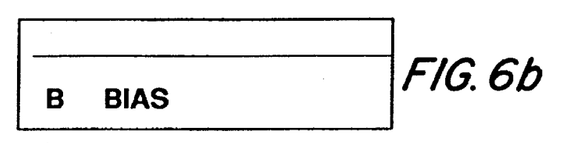
Figure 6C:
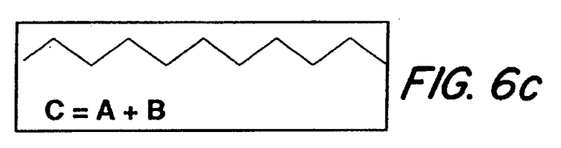
Figure 6D:
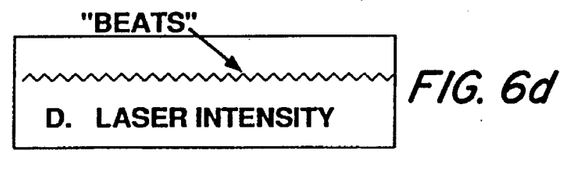
Figure 6E:
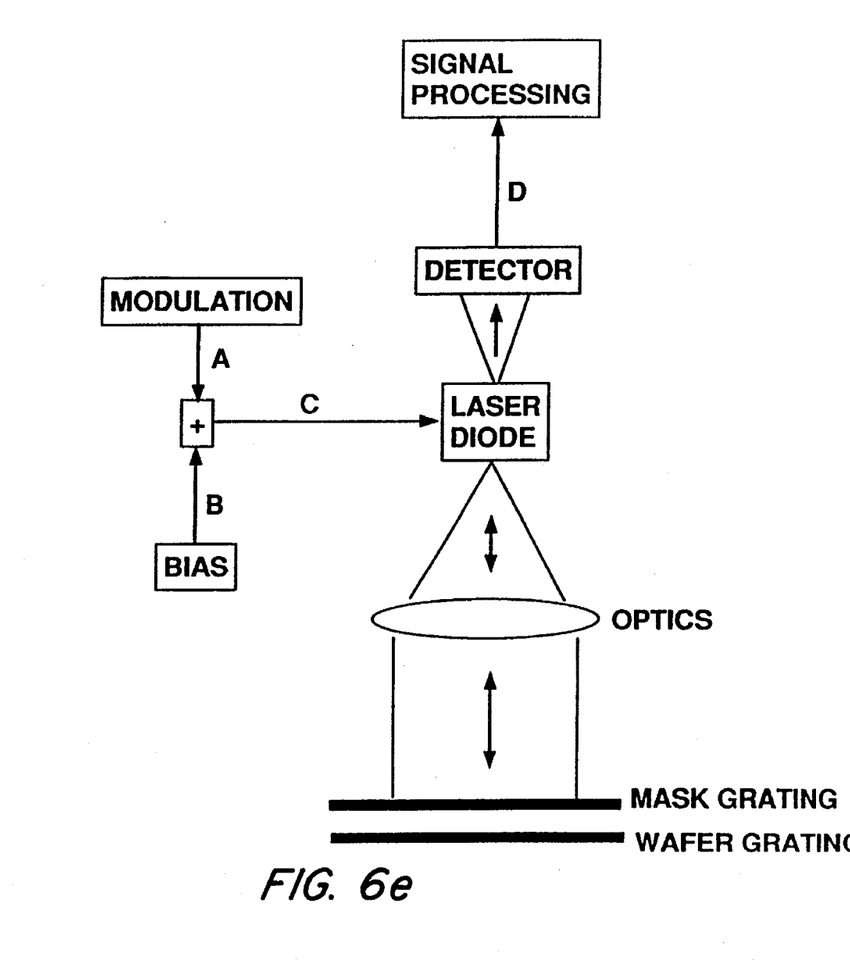

FIG. 5 shows the four paths 1L, 1R, 2L, 2R, for the three dimensional embodiment of the alignment sensor in terms of $\Theta_x$ and $\Theta_y$, which are the sines of the rotation angles about the x and y-axes, respectively. The angles are measured from the z-axis. The effect of grating diffraction in the y-direction is to take $\Theta_{x,in}>0$ to $\Theta_{x,out}<0$ so that the radiation returns almost directly back on itself.

For the absolute value of $\Theta_{x,out}=\Theta_{x,in}$, the electromagnetic radiation returns directly along the incident direction. However, as shown in FIG. 5, the nominal setting for the x-ray exposure tool is to have the absolute value of $\Theta_{x,out}$ close, but not exactly equal to $\Theta_{x,in}$.

In some cases, the illumination could be incident at any angle in the y-z plane. The alignment system of the present invention will function at any angle in the y-z plane because the Fourier transform algorithm used to detect a predetermined frequency component always extracts the same signal bearing portion of the detected intensity from the total detected intensity. Changing the angle will change the combination of diffracted orders that are collected and detected by the sensor. But the selection of the predetermined frequency component with the Fourier transform algorithm will always extract the same frequency portion from the total signal no matter what combination of additional orders is collected and detected. The only limitation are ones of noise and dynamic range. If the noise is increased and/or the dynamic range of the detector is decreased the accuracy of the final alignment value will decrease. However, the electromagnetic illumination is preferably incident within approximately six degrees of the Littrow angle.

With respect to FIG. 1, the angular acceptance lens 6 needs to be increased to accommodate the increased angle between rays 8 and 11. Alternatively, two separate lenses can be used—one for illumination and one for collection. Normal illumination can be used with combined x-y grating marks to provide both x and y position information. This requires separate or independent x and y scans.

To make the overall operation of the alignment sensor more process insensitive, one embodiment of the invention employs four diode lasers projecting discrete wavelengths at selected increments over a range of approximately 700 to 850 nm. This density of wavelengths is approximately equivalent to broadband illumination with respect to process sensitivity on standard wafer structures currently in use and has a much higher brightness than any true broadband source.

In one embodiment, the use of a checkerboard grating on the wafer allows the input and output electromagnetic beam to be at or near the y-direction Littrow angle (i.e., that angle of incidence for which the −1 grating order returns directly along the incident beam) in a direction parallel to the grating lines on the mask grating (i.e. y-direction) and at or near normal incidence in the direction perpendicular to the grating lines on the mask (i.e. x -direction).

The incident and detected return electromagnetic radiation goes through the mask grating on its way to the wafer and after diffracting off the checkerboard grating returns through the same mask grating. As discussed above multiple diffraction paths contribute the same information about the relative positions to detected return electromagnetic radiation. This can be used to assist with alignment if necessary.

Because one embodiment of the present invention can use a collimated beam of electromagnetic radiation and operates at an angle in the y-direction, so that it does not intercept the all zero-order diffraction path from the mask and wafer, the intensity of the return electromagnetic radiation depends on only the relative in-plane motion along the x-axis and is not affected by out-of-plane, that is, z-axis, or "gap" position changes between the mask grating and wafer grating.

The embodiment of the alignment sensor discussed below is used to detect the relative x-position of the mask and wafer. A second alignment sensor (the same as the first alignment sensor) can be oriented at 90° with respect to the first alignment sensor to detect the relative y-position. However, if the phase of the return electromagnetic radiation from a single mask and wafer grating is also sensed, one alignment sensor can measure the x and y-positions simultaneously. Because, in one embodiment, the present invention operates at or near the Littrow angle in the y-z plane, all physical components of the alignment system such as optics, lenses and mechanical mounts can be close together and outside the electromagnetic radiation (e.g. x-ray) exposure path. Thus, the alignment sensor can, if desired, operate during the wafer exposure period.

Because the present invention senses only the relative position of the mask and the wafer and uses collimated electromagnetic radiation, the source and detector do not require precision alignment with respect to either the mask or the wafer unlike some other alignment systems.

The present invention can be operated over a wide range of angles with respect to the normal to the mask/wafer planes. In one preferred embodiment, the incidence and return radiation are at or near the Littrow angle in the y-z plane and at or near the normal incidence and return in the x-z plane.

The Fourier transform of the detected intensity is a function of the relative x-position of the mask and wafer grating. It is used to determine the phase of that particular frequency component with a spatial period of P/2 in the detected return electromagnetic radiation intensity. Therefore, ancillary optics are not required to physically eliminate the other grating orders which contribute to the total return intensity.

The Fourier transform can improve alignment accuracy by approximately the square root of the number of non-zero detected intensity samples during the scan of the wafer grating past the mask grating.

The particular embodiment discussed above is described for proximity printing. The same embodiment will operate in a projection optics system. When operated at the Littrow angle in the y-z plane, it will require no ancillary optics other than those that constitute normal projection optics included in the electromagnetic radiation path between the mask and wafer.

The present invention generates the location of the alignment position from an x-scan of the wafer. The alignment signal is recorded as a function of the relative position of one mark with respect to the other mark. In general, the wafer scans at a constant velocity in the x-direction with respect to a stationary mask. The scan should include at least some alignment signal on either side of the center or aligned position. The scan range can be small—a single scan or a dither. However, generally the scan will be nominally centered on the aligned-position and the scan range will slightly exceed the combined x-width of the two marks in order to provide the entire x-extent of the alignment signal. This large scan provides desirable mark averaging.

A software algorithm, such as a matched filter or Fourier transform based phase determination, can determine the center of symmetry of the alignment signal. This determination is an estimate of the position where the mark-centers coincide or "align". In some configurations it is possible to scan in the x-direction and in the y-direction and determine both x-position and y-positions at one location.

The present invention has definite advantages. It does not require: (1) static staring operation; (2) intensity and/or phase balancing of two electromagnetic beams; (3) two mark-set balancing; and (4) two simultaneously interfering frequencies of electromagnetic radiation. For example, the present invention can operate with one or more discrete wavelengths which operate independently or a broad-band source for wafer and mask process and resist immunity and compensation. In one embodiment, the invention can use one set of marks. In this case, the mask-mark is a crossed grating or the return phase is detected. The wafer-mark contains a small electromagnetic scatter generating pattern that is repeated on a checkerboard lattice.

The sensor hardware can be configured outside of the lithographic illumination path so that the sensor does not have to move between alignment and exposure. In addition, the present invention provides direct mask-to-wafer alignment information independent of the exact position of the hardware of the alignment sensor. Such a feature is useful in an "on-axis" alignment system. Further, the alignment sensor can be configured with an external reference-mark to function as an indirect or transfer sensor. Such a sensor is useful in "off-axis" alignment systems. The technique of the present invention can also be used in other planar or near planar pattern registration activities.

The basic operation is described below—first, the following description describes an implementation of the present invention applicable to both optical and x-ray lithography proximity printing. The technique applies to projection lithography if a lens or equivalent relay is employed between the mask and wafer.

FIG. 4a–b is a drawing of the mask-mark and the wafer-mark with an expanded gap illustrating the multiple-diffraction that generates the direct-reference alignment signal. The x-y-z coordinates are labeled for the marks at the top of the mask.

The mask alignment-mark is "flood-illuminated" by a collimated beam (plane-wave) of electromagnetic radiation. As described in connection with FIG. 1, a suitable illumination source is one or more single spatial mode lasers, such as a helium-neon laser or a visible or near infrared light emitting diode laser. A plane-wave is characterized by its wavelength and direction of propagation. The direction of propagation is indicated by a ray.

Sensor collection optics described earlier in FIG. 1, isolate and direct returned electromagnetic radiation to the photodetector. As described in FIG. 1, a suitable photodetector is a conventional silicon detector or a photodiode. This electromagnetic radiation carries the alignment signal.

The wafer-mark and the mask-mark patterns are designed so that these four "rays" are the dominant energy paths that can reach the photodetector. Some additional rays can reach the photodetector after additional reflections between the mask and wafer. These rays do not affect the operation of the alignment sensor.

The sinusoidal photodetector signal is multiplied by the symmetrical envelope generated by the area overlap of the mask and wafer gratings. The center of symmetry is along the x-centerline at x=0. The shape of this envelope is a function of the mark-patterns and the gap.

Typical commercial lithography equipment provides intermediate wafer alignment. This is done with sufficient accuracy so as to determine the general position to within a distance less than P/2. In addition, the signal envelope contains adequate frequency information to isolate the correct central cycle if a separate intermediate alignment technique is not provided.

Symmetrical alignment mark patterns and the multiple diffraction sequence; through the mask, reflection from the wafer, and back through the mask, provide a direct reference. The alignment signal is a function of the in-plane x-separation between the mask-mark and the wafer-mark x-centerlines.

Typically, three appropriately located mask-mark and wafer-mark pairs are used to measure the three in-plane alignment parameters x, y and in plane rotation to provide the information (for small rotation angles) to align a mask and wafer. Typically, there are three sensors, one for each mask-mark. The mask-marks and wafer-marks need not coincide at the same time. Additional marks can be utilized to measure additional alignment parameters or degrees of freedom. The number of mask-marks and wafer-marks need not be equal. Since this is a direct alignment technique, the alignment sensor's position is not critical and a sensor can move from mark-to-mark.

Collimated spatially-coherent electromagnetic radiation illuminates the mask-mark. The illumination is nominally uniform over the mark-area proper and is limited to the surrounding mark-frame. Four wavelengths may be used to prevent mark diffraction extinction and to provide an opportunity to correct for asymmetric resist flow over the wafer-mark. Favorable results are expected when the illumination source comprises four single wavelength and fundamental spatial mode continuous wave diode lasers. The electromagnetic radiation can be delivered through one polarization-preserving single mode fiber optic. The illumination polarization should be symmetric about the y-axis.

The returned signal electromagnetic radiation is chromatically dispersed by the checkerboard y-period diffraction. The illumination can be chromatically predisposed in the y-direction so that all wavelengths in the returned electromagnetic radiation are collinear or at any other desired y-direction.

The photodetector detects intensity of the return electromagnetic beam. The photodetector has a narrow detection angle provided by a pupil stop 16 in the focal plane of the detector lens 15.

The electromagnetic radiation is delivered to four detectors through a multimode fiber 17. Conventional wavelength filtering separates the four wavelengths for each detector.

Mask and wafer scatter is rejected by field and pupil stops. Additional scatter is rejected by the signal processing associated with the wafer scan.

In the present invention, favorable results are anticipated when the alignment marks operate within a gap range of 5–50 μm. The mask-mark and the wafer-mark grating must have the same x-period. They must also be large enough so that the opposite order diffracted-waves overlap upon returning from the mask and wafer. A wide range of relative mask-mark and wafer-mark sizes are usable. Either one can be the longer or the narrower of the two marks. Either can have a "window" or frame to isolate the mark. No other pattern should be illuminated during the wafer scan. The sensor system can operate with a variety of mask-marks and wafer-marks. Marks can be designed to give enhanced performance for certain process levels and mask-to-wafer gaps.

Each alignment mark has a center of symmetry. When the two centers of symmetry coincide, the wafer and the masks are aligned. In the most general case, the alignment algorithm provides an estimate of this position. In one embodiment, the alignment algorithm can be implemented on an SVG Lithography Systems, Inc. (SVGL) Micrascan digital signal processing board part no. 859-0741. SVGL is located in Wilton, Conn.

Figure 8:
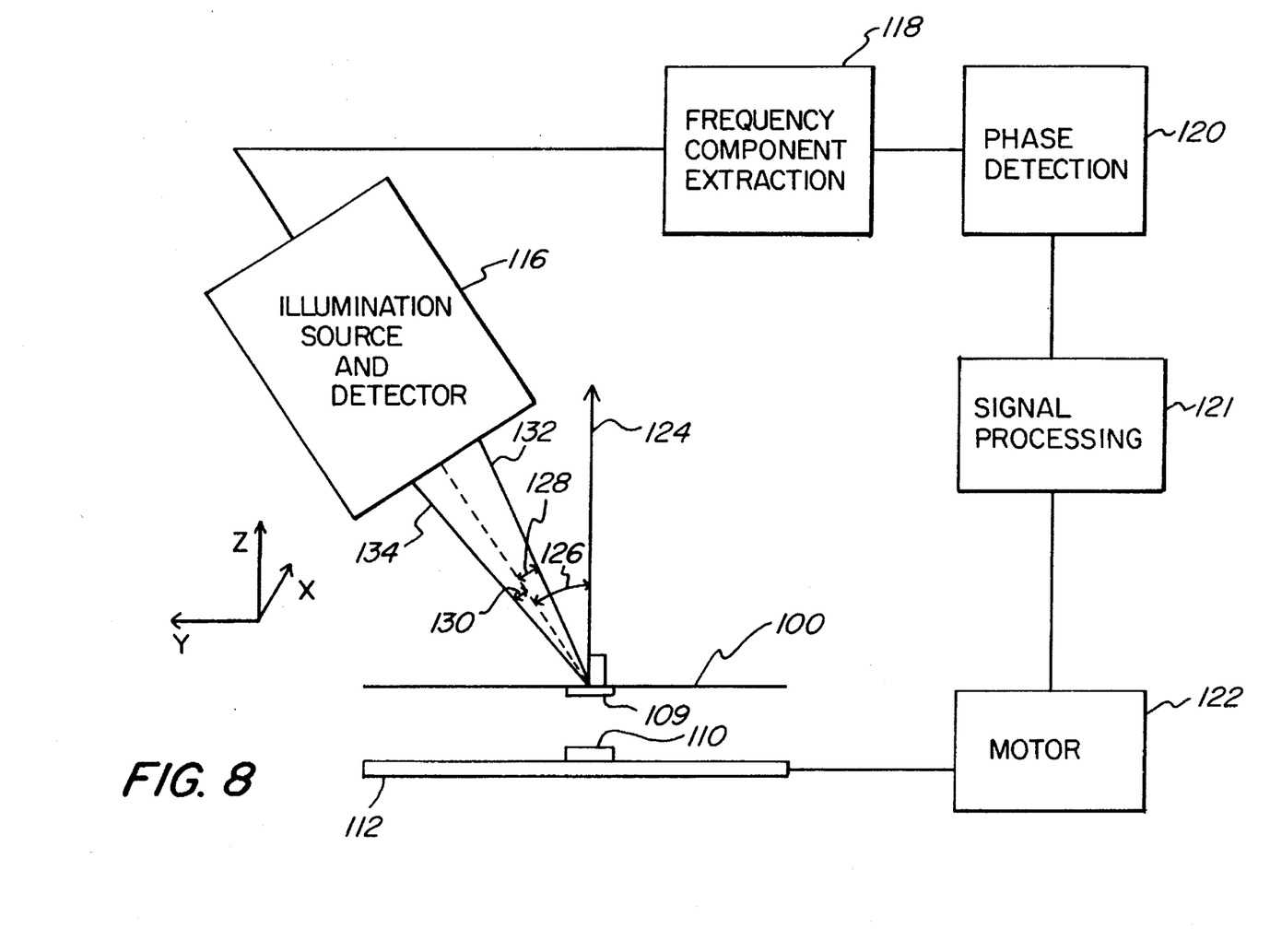
FIG. 8 is a schematic illustration of the present invention.

FIG. 8 illustrates a general embodiment of the present invention. A wafer 100 having a wafer diffraction grating 109 thereon is illuminated by illumination source and detector 116. The electromagnetic radiation from illumination source and detector 116 is incident on the wafer diffraction grating at a small positive offset angle 128, preferably less than approximately ten degrees, from the Littrow angle 126. The Littrow angle 126 may be measured from the z-axis 124. Below the mask 100 is a wafer 112 having a wafer diffraction grating 110 thereon. As discussed in detail above, the electromagnetic radiation from the illuminations source is diffracted by mask grating 109, again by wafer diffraction grating 110, and again by mask diffraction grating 109 before emerging as output electromagnetic radiation 134. The output electromagnetic radiation 134 is collected by the detector portion of illumination source and detector 116. The output electromagnetic radiation 134 is collected at a small negative offset angle 130, preferably less than approximately ten degrees, from the Littrow angle 126. The illumination source and detector 116 is coupled to a frequency component extraction device or means 118. The frequency component extraction device or means 118 selects a predetermined frequency component to extract or look for in the signal generated from the output electromagnetic radiation 134 collected by the detector portion of the illumination source and detector 116. The extraction or detection of the predetermined frequency component can be accomplished by a variety of known means or methods such as Fourier transforms, filtering, or their equivalents. Any means or method would be acceptable as long as the signal bearing portion of the total intensity is accurately extracted. One such method is described above that takes the Fourier transform of $I(x_{mask}-x_{wafer})$ with respect to $x_{wafer}$ at the desired or selected predetermined signal frequency $2\beta_G$. For nearly all of the gratings of the type herein described the predetermined frequency component is $2\beta_G$, which as defined is a function of the spatial period P of the gratings. The desired or selected predetermined signal frequency is the frequency component of the total intensity that is primarily attributable to the diffraction orders having the largest signal to noise ratio and collected and detected by the sensor portion of the illumination source and detector 116. Often this may be the fundamental frequency. After the desired or selected frequency component of the signal representing the electromagnetic radiation is obtained the phase is determined by the phase detection device or means 120. The phase of the selected frequency component provides information on the alignment of the mask 100 and wafer 110. From this the relative position of the mask and wafer gratings 109 and 110 is calculated or obtained by signal processor device or means 121 resulting in the information necessary to accurately align the mask 100 and wafer 110. The signal processor device or means may be any appropriate device, such as a computer, that can perform the signal processing or calculation according to the previously discribed formulas and mathematical techniques. The output of the signal processor devise or means is coupled to a motor 122 for moving the wafer 110. By extracting the predetermined frequency component from the collected electromagnetic radiation signal the alignment system as a whole is simplified, and the accuracy improved by selecting the predetermined frequency component of the signal having a large signal to noise ratio.

Diode Laser Backscatter Modulation Littrow Embodiment

In still another embodiment, the present invention provides that if the angle of incidence of the illuminating collimated beam in the y-z plane corresponds exactly to the Littrow angle of the checkerboard grating in the y-direction, then the return collimated beam is coincident and collinear with the incident beam. In this case, the particularly powerful technique of using optical feedback into the illuminating diode laser becomes possible.

Mask/wafer grating reference can be used without backscatter-modulation and backscatter-modulation can be used with optical schemes other than mask/wafer gratings.

BACKSCATTER-MODULATION OF LASER DIODES:

Electromagnetic radiation from a laser diode coherently "backscattered" on the front facet of the laser diode causes the laser diode output intensity to vary. If the laser diode frequency (or wavelength) is periodically chirped (i.e. swept or varied) by slowly ramping the drive current to the diode, the interference of the backscattered electromagnetic radiation with the output electromagnetic radiation causes a "beat" frequency modulation of the laser diode intensity. The amplitude of this modulation is proportional to the intensity of the return or backscattered electromagnetic radiation. By having the return intensity from the wafer vary with wafer position, as for example, in the mask/wafer grating system discussed above we can use the amplitude of the beat frequency signal to measure wafer position. The general arrangement for backscatter-modulation is shown in FIG. 6a–e.

General Properties of Backscatter Modulation:

The following general properties of backscatter modulation should be considered. First, the intensity of the backscatter should be less than about 5% of the laser diode output which is on the order of a few milliwatts otherwise the laser diode will break into uncontrolled oscillations. Second, backscatter power as low as 10 picowatts can produce detectable signals. The laser frequency variation is on the order of a few GHz per milliamp of drive current, that is, $\Delta f/\Delta I \approx 3 GHz/mAmp$.

A triangle wave drive current modulation will produce a fixed beat frequency. Thus synchronous demodulation techniques can be used to filter noise and unwanted signals. The beat frequency follows directly from:

$$f(t) = f_{nominal} + \frac{\Delta f}{\Delta I} \frac{\Delta I}{\Delta t} t$$

where f(t) is the laser frequency at time t and I is the drive current. For the triangle wave modulation of the drive current, $\Delta I/\Delta t$ is constant and the beat frequency is given by $$f_{beat} = f(t+\Delta t) - f(t) = \Delta t \frac{\Delta f}{\Delta I} \frac{\Delta I}{\Delta t} = \frac{2L}{c} \frac{\Delta f}{\Delta I} \frac{\Delta I}{\Delta t}$$

where we have used the round trip time for the electromagnetic radiation, $\Delta t = 2L/c$ where c is the speed of electromagnetic radiation and L is the distance from the laser diode to the wafer. If the separation between the laser diode and the wafer is $\approx 1$ meter and the drive current is modulated by $\approx 1$ milliamp at $\approx 1$ kHz frequency then the beat frequency is on the order of a few 10's of kHz. Increasing either the amplitude or the frequency of the triangle wave will increase the beat frequency. Also, because of the L dependence of $f_{beat}$, we can use a frequency filter to select only the backscatter from the wafer.

Figure 7:
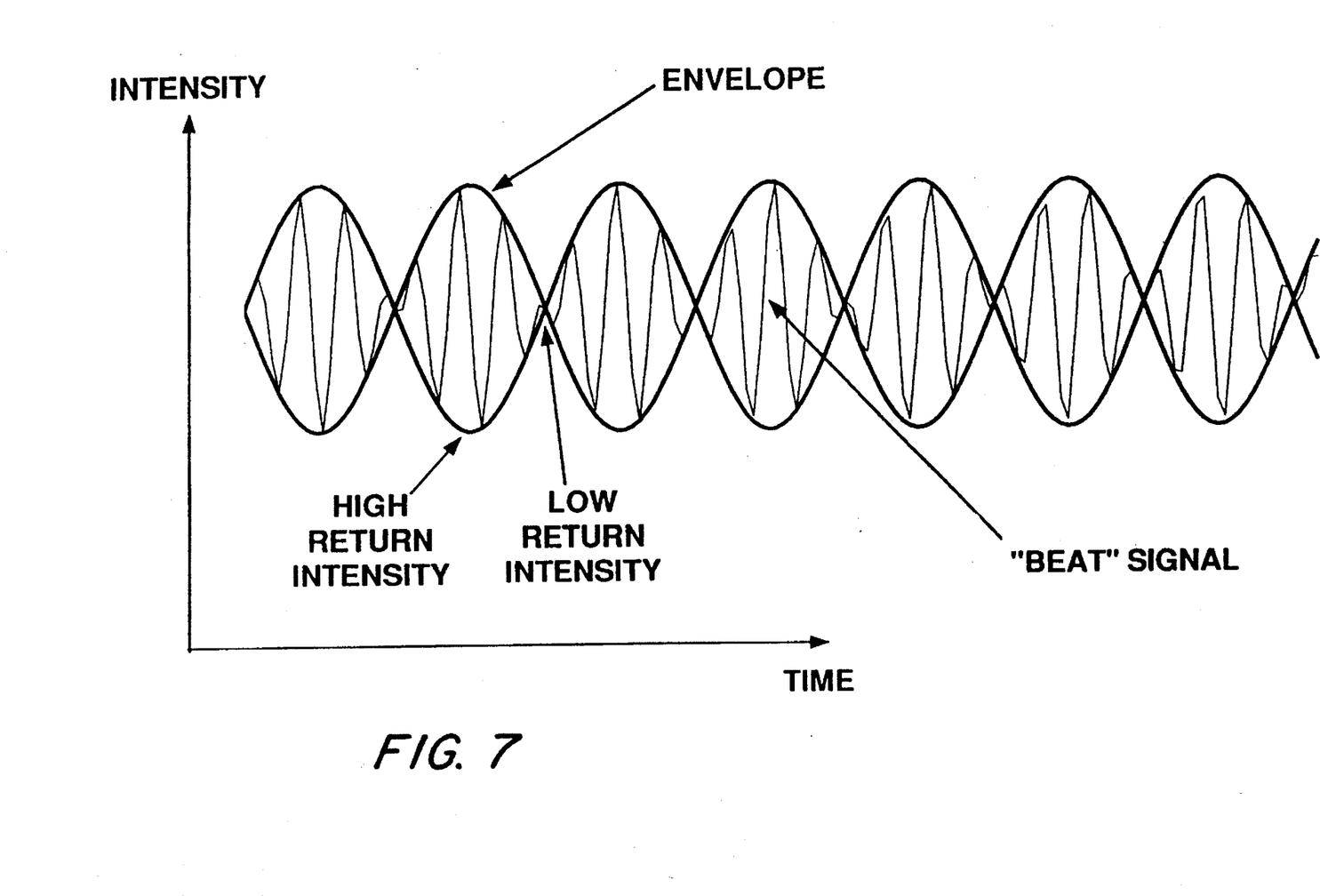
FIG. 7 illustrates that a variation in the intensity of the backscatter modulation causes a variation in the amplitude of the beat signal.

Variation in the intensity of the backscatter causes a variation in the amplitude of the beat signal. Thus the beat signal acts as a carrier wave and the information about the target, i.e., the mask and wafer position, is encoded in the amplitude of the carrier beat signal. This is shown in FIG. 7.

Diode lasers typically are mounted in a "transistor can" together with a detector and with or without a fiber optic "pigtail". This makes packaging of the backscatter modulation embodiment simple.

The active region of the front facet of the diode is on the order of a few microns in size and thus backscatter-modulation is "confocal" at the detection end. Any scatter which is out of focus at the front facet of the diode will contribute little to the backscatter-modulation.

The output of the diode is essentially linearly polarized with the electric field parallel to the diode active layer. Thus polarization sensitive optics can be used to isolate the diode from backscatter not coming from the mask/wafer.

Diode lasers are generally inexpensive and highly reliable. Their lifetimes are on the order of $10^4$ to $10^5$ hours. The range of available wavelengths is roughly 600 to 900 nm.

The present invention improves the alignment accuracy of a mask and wafer in microlithography and is tolerant to different processing variables such as wafer topography and coatings. Additionally, although the preferred embodiments have been illustrated and described, it will be obvious to those skilled in the art that various modifications may be made without departing from the spirit and scop of this invention.

What is claimed is:

1. A grating-grating interferometric alignment system for determining the alignment of a mask and a wafer comprising:

a first diffraction grating placed on the mask;

a second diffraction grating placed on the wafer;

a laser diode illumination source directing electromagnetic radiation of a predetermined frequency onto said first diffraction grating and positioned to receive backscatter from said first and second diffraction gratings;

drive means, coupled to said laser diode, for varying the predetermined frequency of said laser diode;

an electromagnetic radiation intensity detector positioned to collect electromagnetic radiation emitted by said laser diode and the backscatter from the mask and wafer gratings, whereby interference of the electromagnetic radiation causes a beat signal having an amplitude;

signal processing means, coupled to said electromagnetic radiation intensity detector, for determining the mask and wafer alignment from the beat signal; and motor means, coupled to said signal processing means, for moving the first and second gratings relative to each other whereby the mask and wafer are aligned.

2. A grating-grating interferometric alignment system as in claim 1 wherein:

said drive means provides said laser diode illumination source with a ramping drive current.

3. A grating-grating interferometric alignment system as in claim 2 wherein:

the ramping drive current is a triangle wave.

4. An alignment system for determining the alignment of a mask and a wafer comprising:

a first diffraction grating placed on the mask, said first diffraction grating having a first width;

a second diffraction grating placed on the wafer, said second diffraction grating having a second width;

an illumination source directing electromagnetic radiation onto said first diffraction grating near an angle of incidence such that a first grating order returns substantially along the angle of incidence, said illumination source providing four different wavelengths of electromagnetic radiation separated substantially evenly by wavelength;

scanning means, coupled to the wafer, for scanning the wafer a distance at least equal to the first and second widths combined while said illumination source illuminates said first diffraction grating;

an electromagnetic radiation intensity detector positioned near said illumination source to collect electromagnetic radiation diffracted by said first and second diffraction gratings;

phase detection means, coupled to said electromagnetic radiation intensity detector, for determining the phase of a predetermined frequency component of a signal from said electromagnetic radiation intensity detector;

processing means, coupled to said phase detection means, for determining the mask and wafer alignment; and motor means, coupled to said processing means, for moving the first and second gratings relative to each other whereby the mask and wafer are aligned.

5. An alignment system for determining the alignment of a mask and a wafer comprising:

a first diffraction grating placed on the mask, said first diffraction grating having a first width;

a second diffraction grating placed on the wafer, said second diffraction grating having a second width;

an illumination source directing electromagnetic radiation onto said first diffraction grating near an angle of incidence such that a first grating order returns substantially along the angle of incidence, said illumination source providing four different wavelengths of electromagnetic radiation separated substantially evenly by wavelength;

an electromagnetic radiation intensity detector positioned near said illumination source to collect electromagnetic radiation diffracted by said first and second diffraction gratings;

scanning means, coupled to the wafer, for scanning the wafer a distance at least equal to the first and second widths combined while said illumination source illuminates said first diffraction grating;

center of symmetry means, coupled to said electromagnetic radiation intensity detector, for determining the center of symmetry of a signal from said electromagnetic radiation intensity detector;

processing means, coupled to said center of symmetry means, for determining the mask and wafer alignment; and motor means, coupled to said processing means, for moving the first and second gratings relative to each other whereby the mask and wafer are aligned.

* * * * *